United States Patent
Vaschenko et al.

(10) Patent No.: US 8,138,487 B2
(45) Date of Patent: Mar. 20, 2012

(54) SYSTEM, METHOD AND APPARATUS FOR DROPLET CATCHER FOR PREVENTION OF BACKSPLASH IN A EUV GENERATION CHAMBER

(75) Inventors: Georgiy O. Vaschenko, San Diego, CA (US); William N. Partlo, Poway, CA (US); Igor V. Fomenkov, San Diego, CA (US); Richard L. Sandstrom, Encinitas, CA (US); Alexander I. Ershov, Escondido, CA (US); David Brandt, Escondido, CA (US); Joshua J. Miller, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 136 days.

(21) Appl. No.: 12/720,190

(22) Filed: Mar. 9, 2010

(65) Prior Publication Data

US 2010/0258748 A1 Oct. 14, 2010

Related U.S. Application Data

(60) Provisional application No. 61/168,033, filed on Apr. 9, 2009, provisional application No. 61/168,012, filed on Apr. 9, 2009, provisional application No. 61/168,000, filed on Apr. 9, 2009.

(51) Int. Cl.
*A61N 5/00* (2006.01)

(52) U.S. Cl. .................................. 250/504 R; 378/119
(58) Field of Classification Search ............. 250/504 R; 378/119
See application file for complete search history.

(56) References Cited

U.S. PATENT DOCUMENTS

| | | | |
|---|---|---|---|
| 6,507,641 B1 * | 1/2003 | Kondo et al. | 378/119 |
| 6,867,843 B2 | 3/2005 | Ogushi et al. | |
| 7,109,503 B1 | 9/2006 | Bowering et al. | |
| 7,180,081 B2 | 2/2007 | Walker et al. | |
| 7,217,940 B2 | 5/2007 | Partlo et al. | |
| 7,297,968 B2 | 11/2007 | Endo et al. | |
| 2008/0142736 A1 | 6/2008 | Wassink et al. | |
| 2008/0267816 A1 | 10/2008 | Ueno et al. | |

OTHER PUBLICATIONS

PCT International Search Report—PCT/US2010/029436—dated May 25, 2010(2 pgs).

* cited by examiner

*Primary Examiner* — Kiet T Nguyen
(74) *Attorney, Agent, or Firm* — Martine Penilla Group, LLP

(57) ABSTRACT

A system and method generating an extreme ultraviolet light in an extreme ultraviolet light chamber including a collector mirror, a droplet generation system having a droplet outlet aligned to output a plurality of droplets along a target material path and a first catch including a first open end substantially aligned to the target material path and at least one internal surface oriented toward a second end of the first catch, the second end being opposite from the first open end.

22 Claims, 16 Drawing Sheets

SYSTEM, METHOD AND APPARATUS FOR DROPLET CATCHER FOR PREVENTION OF BACKSPLASH IN A EUV GENERATION CHAMBER

CROSS REFERENCE TO RELATED APPLICATIONS

This application claims priority from U.S. Provisional Patent Application No. 61/168,033 filed on Apr. 9, 2009 and entitled "Extreme Ultraviolet Light Output," which is incorporated herein by reference in its entirety for all purposes. This application also claims priority from U.S. Provisional Patent Application No. 61/168,012 filed on Apr. 9, 2009 and entitled "System, Method and Apparatus for Laser Produced Plasma Extreme Ultraviolet Chamber with Hot Walls and Cold Collector Mirror," which is incorporated herein by reference in its entirety for all purposes. This application also claims priority from U.S. Provisional Patent Application No. 61/168,000 filed on Apr. 9, 2009 and entitled "System, Method and Apparatus for Droplet Catcher for Prevention of Backsplash in a EUV Generation Chamber," which is incorporated herein by reference in its entirety for all purposes.

BACKGROUND

The present invention relates generally to laser produced plasma extreme ultraviolet systems, methods and apparatus, and more particularly, to systems, methods and apparatus for droplet management in a laser produced plasma extreme ultraviolet system.

Laser produced plasma (LPP) extreme ultraviolet (EUV) systems produce a plasma by irradiating a droplet of a plasma target material with a source laser. The resulting plasma emits light and a desired wavelength, in this instance, EUV (e.g., less than about 50 nm wavelength and including light at a wavelength of about 13.5 nm or less).

Unfortunately irradiating the droplet of the plasma target material can result in debris from the droplet. The debris can be deposited on the collector mirror and other inner surfaces of the LPP system chamber. The deposited debris can also reduce the amount of EUV light output.

Further, some of the droplets of the target material are not irradiated by the source laser and as a result may produce splashes and other micro-particles and debris that can become deposited on the inner surfaces of the LPP chamber.

In view of the foregoing, there is a need for providing better control of the micro-particles and debris generated during the process of operating in an LPP EUV light source.

SUMMARY

Broadly speaking, the present invention fills these needs by providing an improved catch system and method for capturing the unused droplets in an LPP EUV system. It should be appreciated that the present invention can be implemented in numerous ways, including as a process, an apparatus, a system, or a device. Several inventive embodiments of the present invention are described below.

One embodiment provides an extreme ultraviolet light chamber including a collector mirror, a droplet generation system having a droplet outlet aligned to output a plurality of droplets along a target material path and a first catch including a first open end substantially aligned to the target material path, an enclosed second end, the second end being opposite from the first open end and at least one internal surface oriented toward a second end of the first catch. The at least one internal surface can include at least one step.

The first catch can also include a centered axis substantially aligned to the target material path. The first catch can also include a centered axis at a selected angle to the target material path, the selected angle being between about 1 and about 30 degrees. The first catch can also include one or more baffles, each one of the baffles having a first end, a second end, a first surface and a second surface opposite the first surface, the first end being attached to the inner surface of the first catch, the second surface forming an acute angle to the inner surface of the first catch.

The first open end has a first width and the first catch has second width at the at least one step, the second width being larger than the first width. The first catch can also includes a first portion having a centered axis substantially aligned to the target material path and a second portion forming an angle of between about 1 and about 45 degrees to the target material path.

The first catch can also include a second end opposite the first open end and a quantity of liquid proximate to the second end. The quantity of liquid proximate to the second end can be a liquid state of a target material used to form the plurality of droplets. The quantity of liquid proximate to the second end can extend along at least a portion of the inner surface of the first catch. The quantity of liquid proximate to the second end can include a liquid curtain. The liquid curtain can include a liquid state of a target material used to form the plurality of droplets.

The target material path can be substantially horizontal. The target material path can be substantially vertical. The target material path can be any angle between substantially vertical and substantially horizontal.

The first catch can also include a second end opposite the first open end and a first rotating cylinder proximate to the second end. The first rotating cylinder is positioned such that the target material path is substantially tangential to a first rotating surface of the first rotating cylinder. The first rotating cylinder can be coupled to a cylinder drive capable of driving the first rotating cylinder such that the first rotating surface of the first rotating cylinder has a surface velocity substantially equal to a velocity of the plurality of droplets. A second rotating cylinder can also be included, the second rotating cylinder having a second rotating surface contacting the first rotating surface of the first rotating cylinder.

A second catch can be included, the second catch having a width substantially larger than the first catch, the second droplet recovery tube surrounding the first catch. The first catch can include an outlet. The outlet from the first catch can include a freeze valve. The first open end of the first catch has a width of between about 20 to about 100 mm. The chamber can also include a temperature control system for cooling at least some of the plurality of target material droplets to a temperature less than a melting temperature of the target material.

Another embodiment provides a method of generating an extreme ultraviolet light including outputting a plurality of droplets from a droplet generator in an extreme ultraviolet light chamber, the droplets being output along a target material path, focusing a light source on a selected one of the droplets, irradiating the selected droplet, collecting an extreme ultraviolet light emitted from the plasma created from the irradiated droplet in a collector mirror, focusing the collected extreme ultraviolet light toward an output of the extreme ultraviolet chamber, and recovering a set of non-selected droplets of the droplets in a first catch having a first open end substantially aligned to the target material path, an enclosed second end, the second end being opposite from the first open end and at least one internal surface oriented toward a second end of the first catch.

The method can also include substantially eliminating a backsplash of microdroplets from the non-selected droplets. Substantially eliminating the backsplash of microdroplets can include trapping the microdroplets in at least one of a length of the first catch, a step in the first catch, one or more baffles in the catch, a quantity of liquid in the first catch, or a moving surface in the first catch.

Substantially eliminating the backsplash of microdroplets can include cooling the non-selected droplets to a temperature less than a melting temperature of the target material. Cooling the non-selected droplets to the temperature less than the melting temperature of the target material includes at least one of directing a cooled gas flow toward the non-selected droplets or cooling the first catch to the temperature less than a melting temperature of the target material.

Yet another embodiment provides an extreme ultraviolet light chamber including a collector mirror and multiple microparticle catches covering at least a portion of an inner surface of the extreme ultraviolet light chamber.

Still another embodiment provides a extreme ultraviolet light chamber includes a collector mirror and a target material generator system, wherein the target material generator system is oriented to emit target material along a target material path and wherein the target material path forms an angle of between about 1 degree and about 90 degrees to an XY plane, wherein the XY plane is normal to a Z axis and wherein the Z axis is a light path for an EUV light reflected from the collector mirror.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for an improved catch system and method for capturing the unused droplets in an LPP EUV system will now be described. It will be apparent to those skilled in the art that the present invention may be practiced without some or all of the specific details set forth herein.

One LPP technique involves generating a stream of target material droplets and irradiating some or all of the droplets with light pulses, e.g. zero, one or more pre-pulse(s) followed by a main pulse. In more theoretical terms, LPP light sources generate EUV radiation by depositing light or laser energy into a target material having at least one EUV emitting element (e.g., xenon (Xe), tin (Sn) or lithium (Li)), creating a highly ionized plasma with electron temperatures of several 10's of eV. The energetic radiation generated during de-excitation and recombination of these ions is emitted from the plasma in all directions.

A near-normal-incidence mirror (a "collector mirror") is positioned at a relatively short distance (e.g., 10-50 cm) from the plasma to collect, direct and focus the EUV light to an intermediate location or focal point. The collected EUV light can then be relayed from the intermediate location to a set of scanner optics and ultimately to a target, such as a semiconductor wafer, in a photolithography process.

The collector mirror includes a delicate and relatively expensive multi-layer coating to efficiently reflect EUV light. Keeping the surface of the collector mirror relatively clean and protecting the surface from unwanted plasma-generated debris is a challenge facing the EUV light source developers.

In an exemplary arrangement that is currently being developed with the goal of producing about 100 W at the intermediate location, a pulsed, focused 10-12 kW $CO_2$ drive laser (or suitable other laser such as an excimer laser) is synchronized with a droplet generator to sequentially irradiate about 10,000-200,000 tin droplets per second. This arrangement needs to produce a stable stream of droplets at a relatively high repetition rate (e.g., 10-200 kHz or more) and deliver the droplets to an irradiation site with high accuracy and good repeatability in terms of timing and position over relatively long periods of time.

Figure 1:
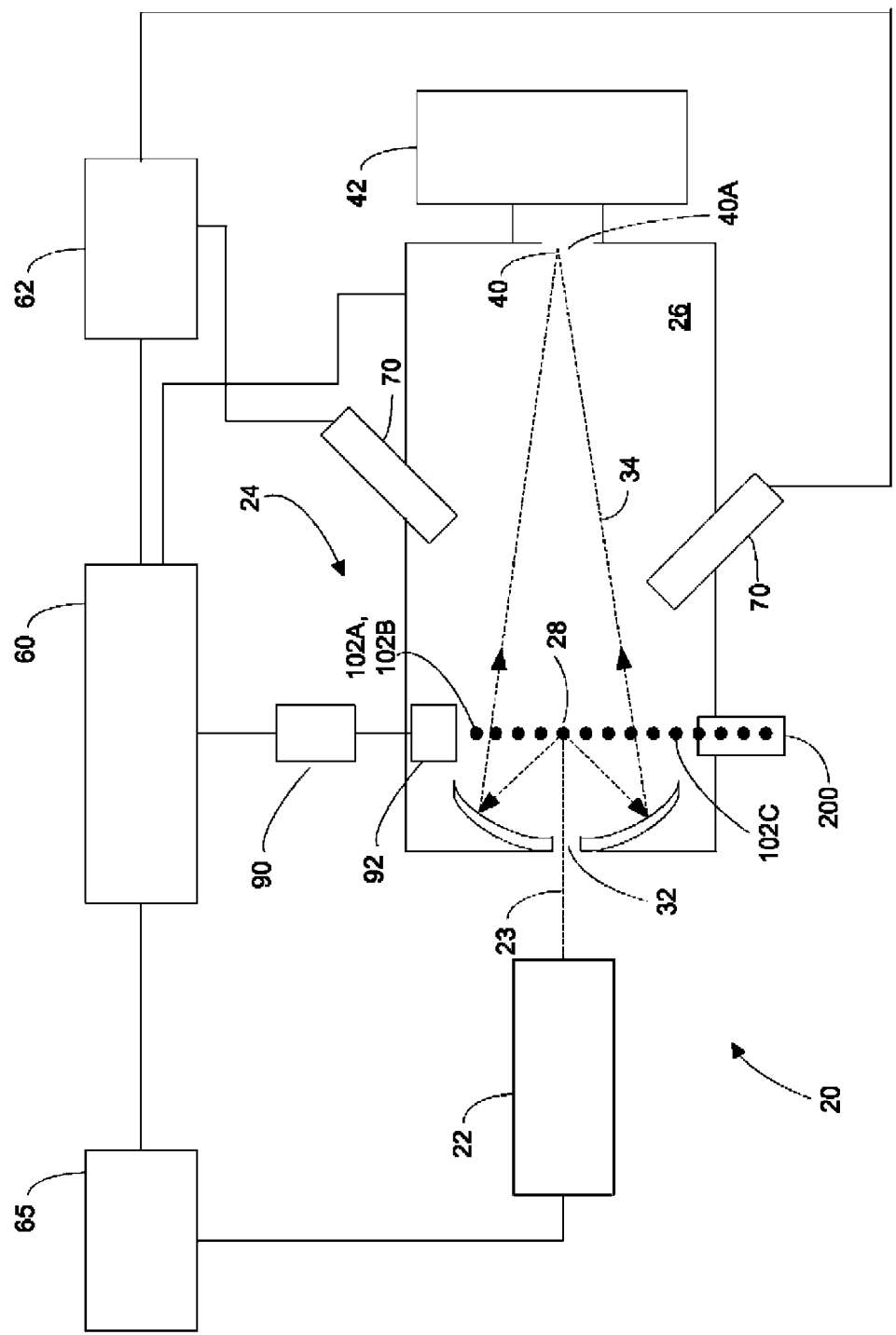
FIG. 1 is a schematic view of a laser-produced-plasma EUV light source, in accordance with embodiments of the disclosed subject matter.

FIG. 1 is a schematic view of a laser-produced-plasma EUV light source 20, in accordance with embodiments of the disclosed subject matter. The LPP light source 20 includes a light pulse generation system 22 for generating a train of light pulses and delivering the light pulses into an EUV chamber 26. Each light pulse 23 travels along a beam path from the light pulse generation system 22 and into the EUV chamber 26 to illuminate a respective target droplet at an irradiation region 28.

Suitable lasers for use in the light pulse generation system 22 shown in FIG. 1, may include a pulsed laser device, e.g., a pulsed gas discharge $CO_2$ laser device producing radiation at about 9.3 µm or about 10.6 µm, e.g., with DC or RF excitation, operating at relatively high power, e.g., about 10 kW or higher and high pulse repetition rate, e.g., about 10 kHz or more. In one particular implementation, the laser in the light pulse generation system 22 may be an axial-flow RF-pumped $CO_2$ laser having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, and focused before reaching the irradiation region 28.

Continuously pumped $CO_2$ amplifiers may be used for the light pulse generation system 22. For example, a suitable $CO_2$ laser device having an oscillator and three amplifiers (O-PA1-PA2-PA3 configuration) is disclosed in co-pending U.S. patent application Ser. No. 11/174,299 filed on Jun. 29, 2005, entitled, LPP EUV LIGHT SOURCE DRIVE LASER SYSTEM, the entire contents of which are hereby incorporated by reference herein.

Alternatively, the laser in the light pulse generation system 22 may be configured as a so-called "self-targeting" laser system in which the droplet serves as one mirror of the optical cavity. In some "self-targeting" arrangements, a master oscillator may not be required. Self targeting laser systems are disclosed and claimed in co-pending U.S. patent application Ser. No. 11/580,414 filed on Oct. 13, 2006, entitled, DRIVE LASER DELIVERY SYSTEMS FOR EUV LIGHT SOURCE, the entire contents of which are hereby incorporated by reference herein.

Depending on the application, other types of lasers may also be suitable for use in the light pulse generation system 22, e.g., an excimer or molecular fluorine laser operating at high power and high pulse repetition rate. Other examples include, a solid state laser, e.g., having a fiber, rod or disk shaped active media, a MOPA configured excimer laser system, e.g., as shown in U.S. Pat. Nos. 6,625,191, 6,549,551, and 6,567,450, the entire contents of which are hereby incorporated by reference herein, an excimer laser having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, a power oscillator/power amplifier (POPA) arrangement, or a solid state laser that seeds one or more excimer or molecular fluorine amplifier or oscillator chambers, may be suitable. Other designs are possible.

Referring again to FIG. 1, the EUV light source 20 may also include a target material delivery system 24, e.g., delivering droplets of a target material into the interior of a chamber 26 to the irradiation region 28, where the droplets 102A, 102B will interact with one or more light pulses 23, e.g., one or more pre-pulses and thereafter one or more main pulses, to ultimately produce a plasma and generate an EUV emission 34. The target material may include, but is not necessarily limited to, a material that includes tin, lithium, xenon, etc., or combinations thereof. The EUV emitting element, e.g., tin, lithium, xenon, etc., may be in the form of liquid droplets and/or solid particles contained within liquid droplets 102A, 102B.

By way of example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in co-pending U.S. patent application Ser. No. 11/406,216, filed on Apr. 17, 2006, entitled ALTERNATIVE FUELS FOR EUV LIGHT SOURCE, the contents of which are hereby incorporated by reference herein.

Referring further to FIG. 1, the EUV light source 20 includes a collector mirror 30. The collector mirror 30 is a near-normal incidence collector mirror having a reflective surface in the form of a prolate spheroid (i.e., an ellipse rotated about its major axis). The actual shape and geometry can of course change depending on the size of the chamber and the location of focus. The collector mirror 30 can include a graded multi-layer coating in one or more embodiments. The graded multi-layer coating can include alternating layers of Molybdenum and Silicon, and in some cases one or more high temperature diffusion barrier layers, smoothing layers, capping layers and/or etch stop layers.

The collector mirror 30 also includes an aperture 32. The aperture 32 allows the light pulses 23 generated by the light pulse generation system 22 to pass through to the irradiation region 28. The collector mirror 30 can be a prolate spheroid mirror that has a first focus within or near the irradiation region 28 and a second focus at an intermediate region 40. The EUV light 34 is output at or near the intermediate region 40 from the EUV light source 20 and input to a device 42 utilizing EUV light 34. By way of example, the device 42 that receives the EUV light 34 can be an integrated circuit lithography tool.

It is to be appreciated that other optics may be used in place of the prolate spheroid mirror 30 for collecting and directing EUV light 34 to an intermediate location for subsequent delivery to a device utilizing the EUV light. By way of example the collector mirror 30 can be a parabola rotated about its major axis. Alternatively, the collector mirror 30 can be configured to deliver a beam having a ring-shaped cross-section to the intermediate location 40 (e.g., co-pending U.S. patent application Ser. No. 11/505,177, filed on Aug. 16, 2006, entitled EUV OPTICS, the contents of which are hereby incorporated by reference).

The EUV light source 20 may also include an EUV controller 60. The EUV controller 60 can include a firing control system 65 for triggering one or more lamps and/or laser devices in the light pulse generation system 22 to thereby generate light pulses 23 for delivery into the chamber 26.

The EUV light source 20 may also include a droplet position detection system including one or more droplet imagers 70. The droplet imagers 70 can capture images using CCD's or other imaging technologies and/or backlight stroboscopic illumination and/or light curtains that provide an output indicative of the position and/or timing of one or more droplets 102A, 102B relative to the irradiation region 28. The imagers 70 are coupled to and output the droplet location and timing data to a droplet position detection feedback system 62. The droplet position detection feedback system 62 can compute a droplet position and trajectory, from which a droplet error can be computed. The droplet error can be calculated on a droplet by droplet basis or on average droplet data. The droplet position error may then be provided as an input to the EUV controller 60. The EUV controller 60 can provide a position, direction and/or timing correction signal to the light pulse generation system 22 to control a source timing circuit and/or to control a beam position and shaping system to change the trajectory and/or focal power or focal point of the light pulses being delivered to the irradiation region 28 in the chamber 26.

The EUV light source 20 can also include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

The EUV light source 20 can also include a droplet control system 90, operable in response to a signal (which in some implementations may include the droplet error described above, or some quantity derived therefrom) from the EUV controller 60, to e.g., modify the release point of the target material from a target material dispenser 92 and/or modify droplet formation timing, to correct for errors in the droplets 102A, 102B arriving at the desired irradiation region 28 and/or synchronize the generation of droplets 102A, 102B with the light pulse generation system 22.

Figure 2A:
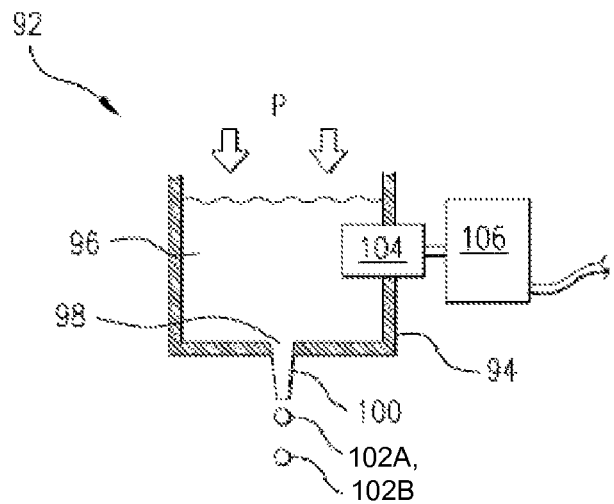
FIG. 2A is a schematic of the components of a simplified target material dispenser that may be used in some or all of the embodiments described herein in accordance with embodiments of the disclosed subject matter.

FIG. 2A is a schematic of the components of a simplified target material dispenser 92 that may be used in some or all of the embodiments described herein in accordance with embodiments of the disclosed subject matter. The target material dispenser 92 includes a conduit or reservoir 94 holding a fluid form of the target material 96. The fluid target material 96 can be a liquid such as a molten metal (e.g., molten tin), under a pressure, P. The reservoir 94 includes an orifice 98 allowing the pressurized fluid target material 96 to flow through the orifice 98 establishing a continuous stream 100. The continuous stream 100 subsequently breaks into a stream of droplets 102A, 102B. The target material dispenser 92 further includes a sub-system producing a disturbance in the fluid having an electro-actuatable element 104 that is operable, coupled with the fluid target material 96 and/or the orifice 98 and a signal generator 106 driving the electro-actuatable element 104.

More details regarding various droplet dispenser configurations and their relative advantages may be found in co-pending U.S. patent application Ser. No. 12/214,736, filed on Jun. 19, 2008, entitled SYSTEMS AND METHODS FOR TARGET MATERIAL DELIVERY IN A LASER PRODUCED PLASMA EUV LIGHT SOURCE, U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE, co-pending U.S. patent application Ser. No. 11/358,988, filed on Feb. 21, 2006, entitled LASER PRODUCED PLASMA EUV LIGHT SOURCE WITH PRE-PULSE, co-pending U.S. patent application Ser. No. 11/067,124, filed on Feb. 25, 2005, entitled METHOD AND APPARATUS FOR EUV PLASMA SOURCE TARGET DELIVERY, and co-pending U.S. patent application Ser. No. 11/174,443, filed on Jun. 29, 2005, entitled LPP EUV PLASMA SOURCE MATERIAL TARGET DELIVERY SYSTEM, the contents of each of which are hereby incorporated by reference.

The droplets 102A, 102E are between about 20 and about 100 µm in diameter. The droplets 102A, 102B are produced by pressurizing target material 96 through the orifice 98. By way of example, the orifice 98 can have a diameter of less than about 50 µm in one embodiment. The droplets 102A, 102B are launched at a velocity of about 20 to 70 m/s. Due to the high velocity of the droplets 102A, 102B, the droplet stay on the nearly straight target material path 209 and do not impinge on the collector mirror 30, whether the droplets stream is produced in horizontal, vertical, or some other orientation. In one embodiment, not all the droplets 102A, 102B produced by the target material dispenser 92 in continuous mode are used for plasma generation. If the EUV source works with a duty cycle of less than 100% a portion of the droplets 102C will pass the irradiation region 28 and can be collected thereafter. If the unused droplets 102C are allowed to impact the opposite wall of the EUV source chamber they will produce a large amount of fast moving fragments with broad spatial distribution. Significant portions of these fragments 231 will be deposited on the EUV collector mirror 30 and diagnostic ports and devices 70, thus affecting their performance.

Another source of the debris is the irradiation region 28. When irradiated with intense light pulses the droplets 102A, 102B are heated on one side that results in rapid asymmetric material expansion and EUV light emissions 230. As described above the EUV light emissions 230 are collected in the collector mirror 30. As a result of the expansion a significant amount of droplet material is accelerated in the direction away from the light pulse 23 with velocities comparable to the velocity of the droplets 102A, 102B as they are output from the target material dispenser 92. This material is traveling away from the irradiation region 28 until it strikes some surface, at which point it can be reflected or backsplashed in various directions. The backsplashed target material 231 may be deposited on the collector mirror 30.

Figure 2D:
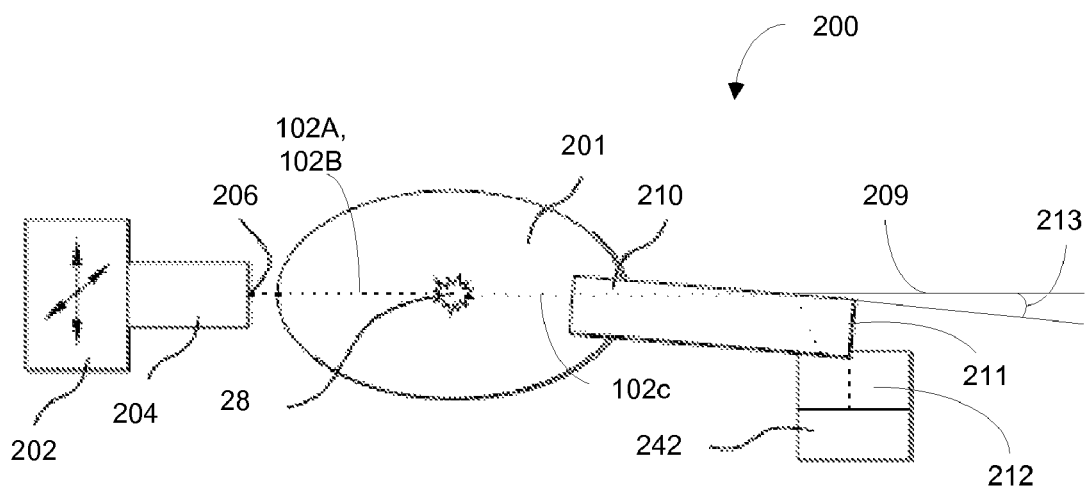
FIG. 2D is another schematic of the first catch in accordance with embodiments of the disclosed subject matter.
Figure 2B:
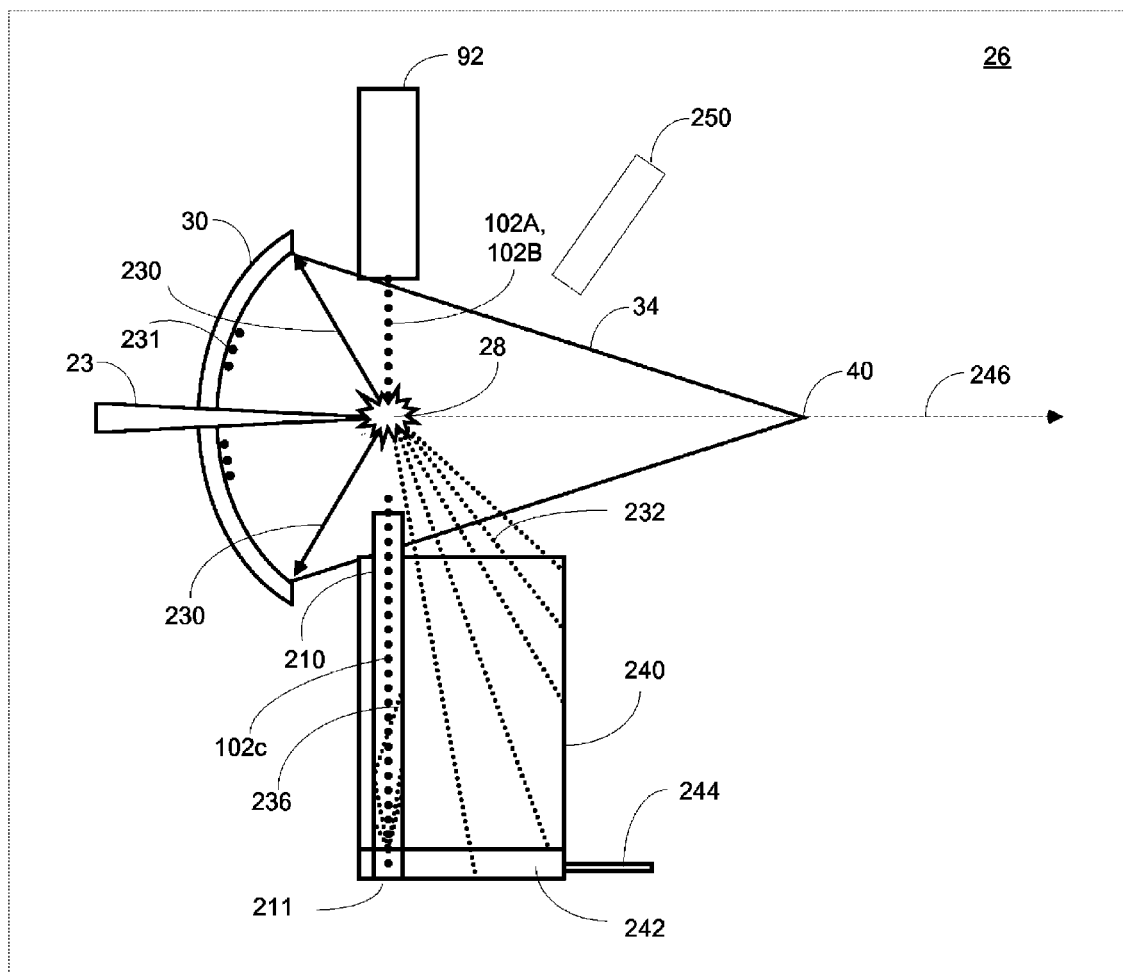
FIGS. 2B and 2C are more detailed schematics of some of the components in a EUV chamber in accordance with embodiments of the disclosed subject matter.
Figure 2C:
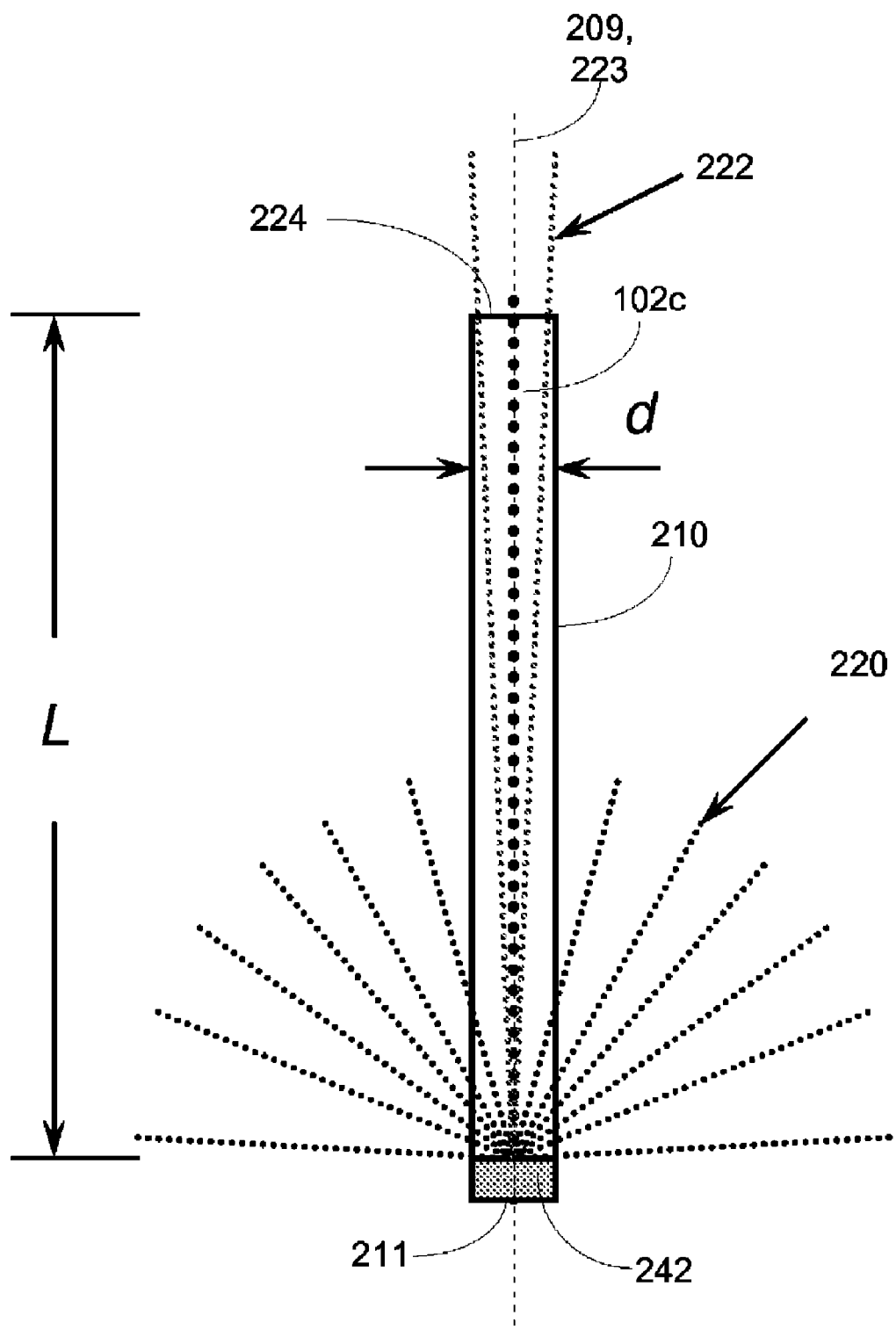

FIGS. 2B and 2C are more detailed schematics of some of the components in a EUV chamber in accordance with embodiments of the disclosed subject matter. As described above, the target material dispenser 92 outputs a stream of droplets 102A, 102B, however, not all of the droplets are irradiated (i.e., used) to generate the EUV 34. By way of example unused droplets 102C are not irradiated by the incoming light pulses 23.

The unused droplets 102C are captured in a first catch 210 so as to minimize any backsplash of the unused droplets within the EUV chamber 26. The backsplash 236 can be in the form of microdroplets or liquid droplets. The unused droplets 102C strike the bottom 211 of the first catch 210. Microdroplets 236 can reflect multiple times from the bottom and off the walls of first catch 210 and a portion of the micro particles 222, as shown in FIG. 2C, can escape back into the EUV chamber 26 and a portion of the microdroplets 231 can deposit on various surface such as on the collector mirror 30. Microdroplets 220 are shown in phantom to illustrate some of the backsplash of microdroplets that are captured or prevented by the catch 210.

The first catch 210 can be an elongated tube having a cross section that can be circular, oblong, oval, rectangular, square, or any other suitable shape. As shown in FIG. 2C, the first catch 210 includes an open end 224 oriented toward the target material dispenser 92. The open end 224 can be substantially centered on the target material path 209. The first catch 210 also includes a centerline 223 that may or may not be aligned to the target material path 209 as will be described in more detail below.

The backsplash is reduced or minimized by using a tube having a relatively large aspect ratio L/W, e.g. greater than about 3 and preferably greater than about 8, where L is the tube length and W is the inside tube dimension normal to L at the first end (i.e., entrance). Upon striking the inner wall of the first catch 210, the unused droplets 102C and/or microdroplets and/or fragments of droplets reduce their velocity and the unused droplets can be captured in the first catch, as shown.

As shown in FIG. 2B, the irradiated droplets can also produce microdroplets 232 after being irradiated. The microdroplets 232 can be distributed around the EUV chamber 26. A portion of the microdroplets 231 can be deposited on the collector mirror 30. A portion of the microdroplets 232 can be captured in a second catch 240. The first catch 210 and second catch 240 can also be heated.

Parts, or all of the first and second catches 210, 240, may have double walls. The space between the double walls can be filled with, or designed to pass one or more heat exchange fluids, or gases such as air, nitrogen, water, tin, gallium, tin-gallium alloy, etc., for the efficient thermal management of the catch 210, 240.

Figure 2E:
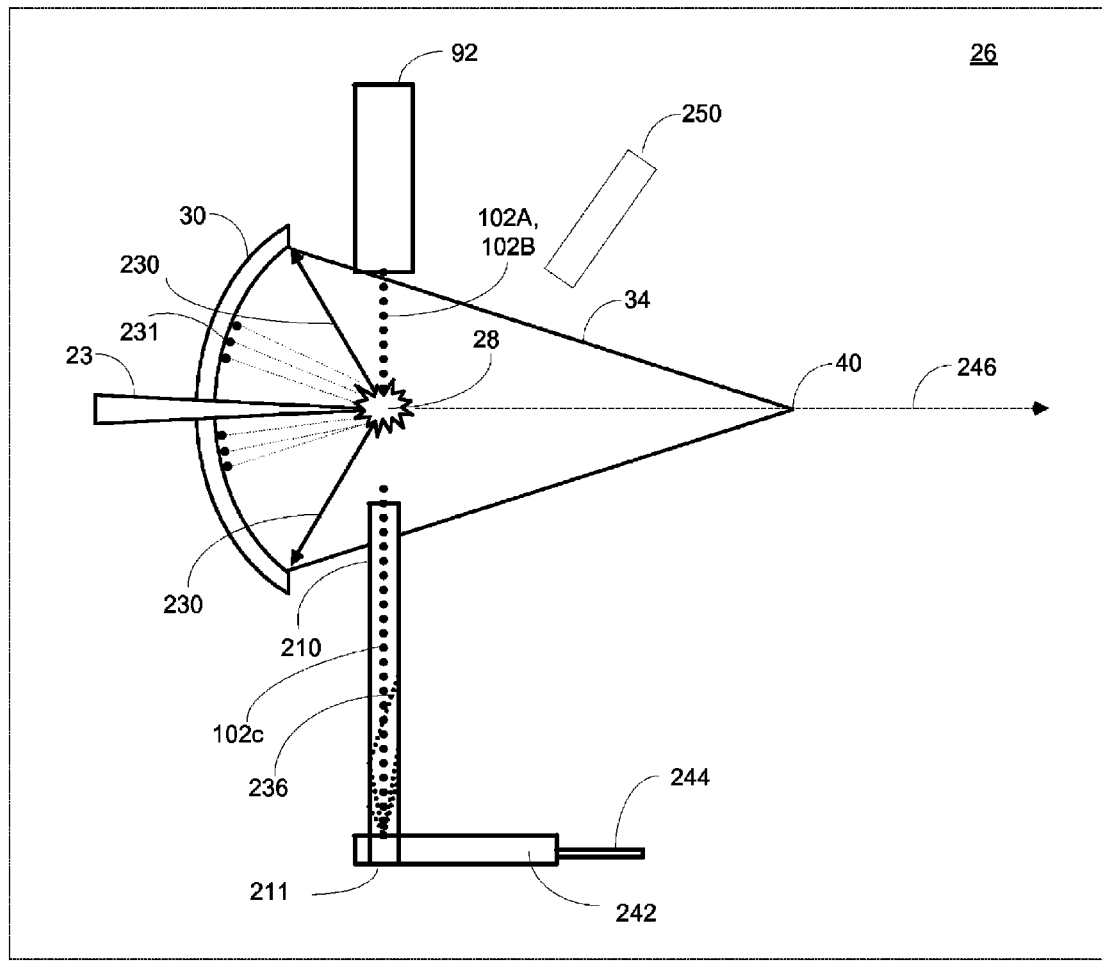
FIG. 2E is another schematic of the first catch in accordance with embodiments of the disclosed subject matter.

FIG. 2E is another schematic of the first catch 210 in accordance with embodiments of the disclosed subject matter. As shown in FIG. 2E, the second catch 240 is optional.

FIG. 2D is another schematic of the first catch 210 in accordance with embodiments of the disclosed subject matter. The catch 210 can be angled slightly relative to the target material path 209 (e.g., angle 213) such that the unused droplets 102C first impact the inner walls of the first catch 210. If the first impact is with the inner wall of the first catch 210, the unused droplets 102C are less likely to be deflected back out of the first catch or to impact the opposite end f the first catch with sufficient energy so as to cause a splash that may allow some splashed material to escape out of the first catch and back toward the collector mirror 30. The bottom 211 of the first catch 210 can be open to allow the unused droplets 102C to pass beyond the bottom of the first catch to a reservoir 212. The reservoir 212 contains a quantity of target material 242 in a liquid form that includes previously captured unused droplets. Further as shown in FIG. 2D the target material dispenser 92 can output the stream of droplets 102A, 102B toward the first catch 210 in an approximately horizontal direction.

In this configuration, with the droplet generator positioned outside of the projection of the collector optic on the horizontal plane, droplets 102A, 102B produced by the generator 92 with velocity v in the horizontal direction are deflected in the vertical direction from the original target material path at a distance from the droplet generator L by the amount d that is given by:

$$d = \frac{g}{2}\left(\frac{L}{v}\right)^2$$

where g is the gravitational acceleration.

Thus, for a droplet velocity of 20 m/s and a distance from the droplet generator of L=30 mm the deviation from the horizontal direction d is only 1.1 mm. Therefore, for practical droplets velocities, the droplets launched in the horizontal direction would arrive to the plasma point and subsequently to the catch substantially in a straight horizontal line. Similar arguments can be applied to the other non-vertical orientations of the droplet generator.

Figure 3:
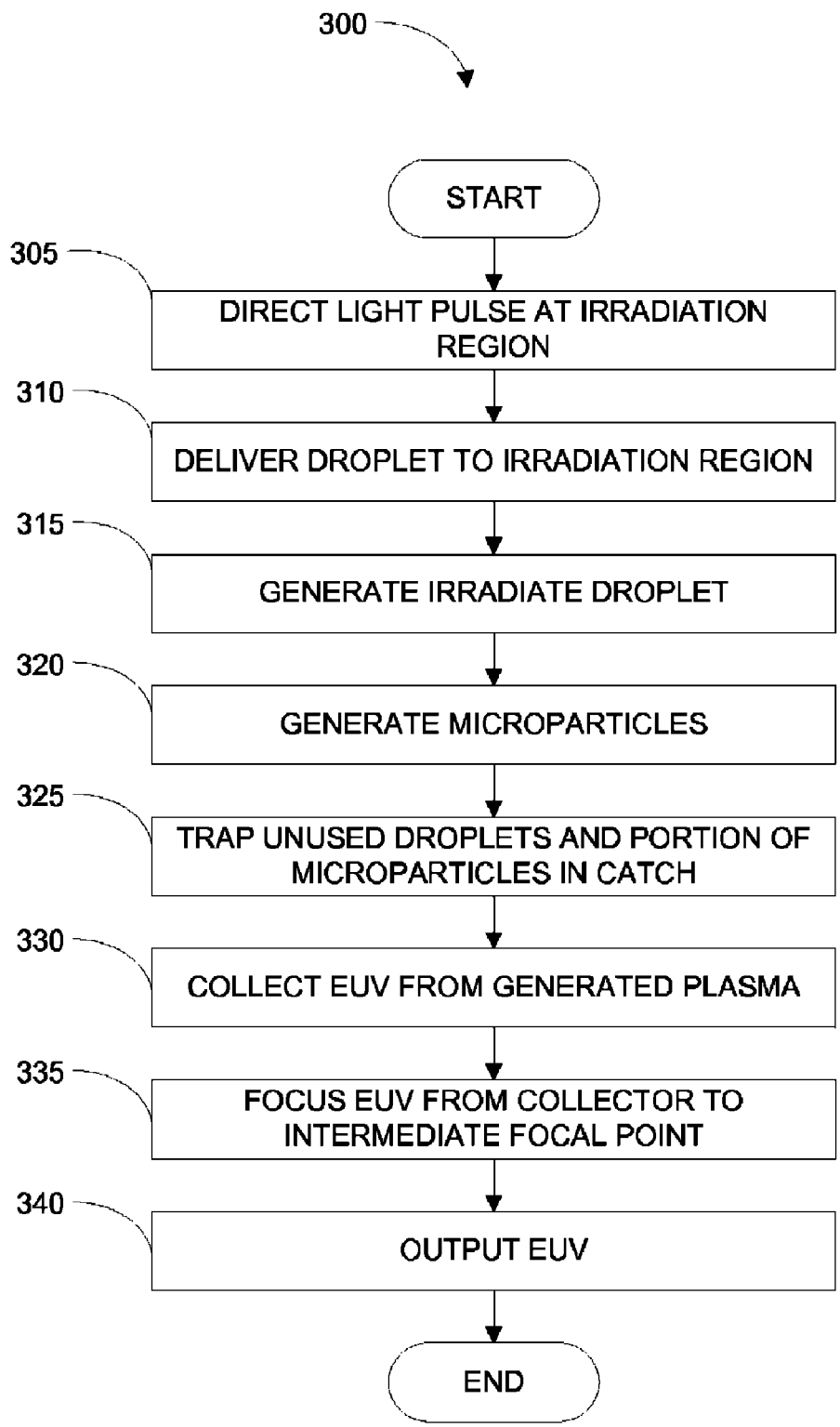
FIG. 3 is a flowchart diagram that illustrates the method operations performed in generating EUV, in accordance with embodiments of the disclosed subject matter.

FIG. 3 is a flowchart diagram that illustrates the method operations 300 performed in generating EUV 34, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 300 will now be described. In an operation 305, a light pulse 23 is directed to the irradiation region 28 in the EUV chamber 26. In an operation 310, a selected one of a stream of droplets 102A, 102B is delivered to the irradiation region 28 at substantially the same time the light pulse 23 arrives at the irradiation region and EUV light 34 is generated from the irradiated droplet in an operation 315.

In an operation 320, a first portion microdroplets 232 are generated from the irradiated droplet. In an operation 325, a second portion of the microdroplets 232 and the unused droplets 1020 of the stream of droplets 102A, 102B are captured in the first and/or second catches 210, 240. As described above the backsplash of microdroplets and droplets 236 are substantially captured.

In an operation 330, the EUV from the irradiation region 28 is collected by the collector mirror 30. The collector mirror 30 focuses the EUV 34 to an intermediate location 40 in an operation 335 and in an operation 340, the EUV 34 is output from the EUV chamber.

Figure 4A:
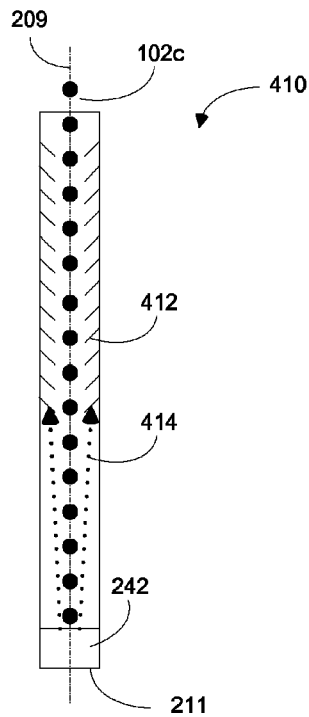
FIGS. 4A-4D are schematics of alternative first catches, in accordance with embodiments of the disclosed subject matter.

FIGS. 4A-4D and 4G are schematics of alternative first catches 410, 420, 430, 440, 496 in accordance with embodiments of the disclosed subject matter. The alternative first catches 410, 420, 430, 440, 496 include one or more internal surfaces oriented toward the bottom end 211 of the first catch so as to substantially prevent most of the backsplash from the bottom end of the first catch. Referring to FIG. 4A, an alternative first catch 410 includes baffles 412 along the inner surface of the catch. The baffles 412 capture the backsplatter 414 from the impact of the unused droplet stream 102C with the bottom of the catch. The baffles 412 form an acute angle with the inside surface of the catch 410 and angled toward the bottom of the catch so as to not present a surface perpendicular to the target material path.

Figure 4B:
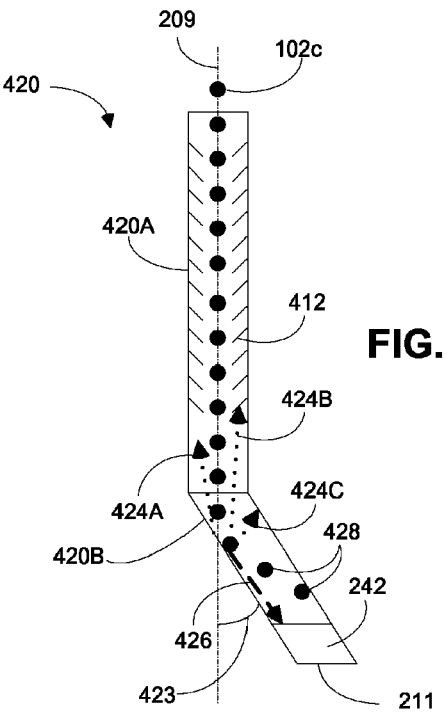

Referring to FIG. 4B, another alternative first catch 420 optionally includes baffles 412 along the inner surface of the catch. The alternative first catch 420 also includes a first portion 420A that is substantially aligned to the target material path 209 and a second portion 420B that is angled relative to the target material path at an angle 423. Angle 423 can be between about 1 and about 45 degrees relative to the target material path 209. The angled portion 420B causes the unused droplets 102C to impact the inner surface of the first catch 420 and the angle 423. Impacting the inner surface of the first catch 420 at an angle more gradually slows the unused droplets and reduces the back splatter 424A, 424B and causes a portion 424C of the unused droplets to reflect to opposite side of the inner surface the catch 420. The unused droplets and backsplatter 424A, 424B are captured in the bottom of the catch 420. A portion of liquid target material 242 can be maintained in the bottom of the catch 420 to further reduce the back splatter as described above.

Figure 4C:
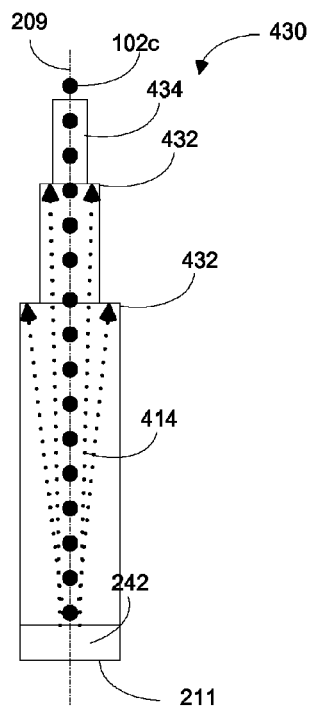

Referring to FIG. 4C, another alternative first catch 430 optionally includes one or more steps 432. The steps 432 reduce the width or diameter of the catch 430 along the inner surface with a wider width or diameter toward the bottom and a narrower width or diameter near the opening of the catch. The steps 432 reduce the backsplatter similar to the baffles 412 described above.

Figure 4D:
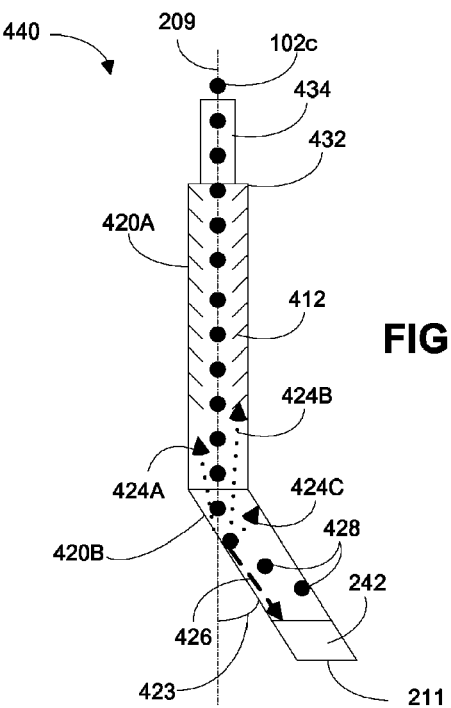

Referring to FIG. 4D, another alternative first catch 440 is a combination of the alternative first catches 410, 420 and 430. The combination first catch 440 includes one or more steps 432, multiple baffles 412 and an angled portion 420B as described above.

Figure 4E:
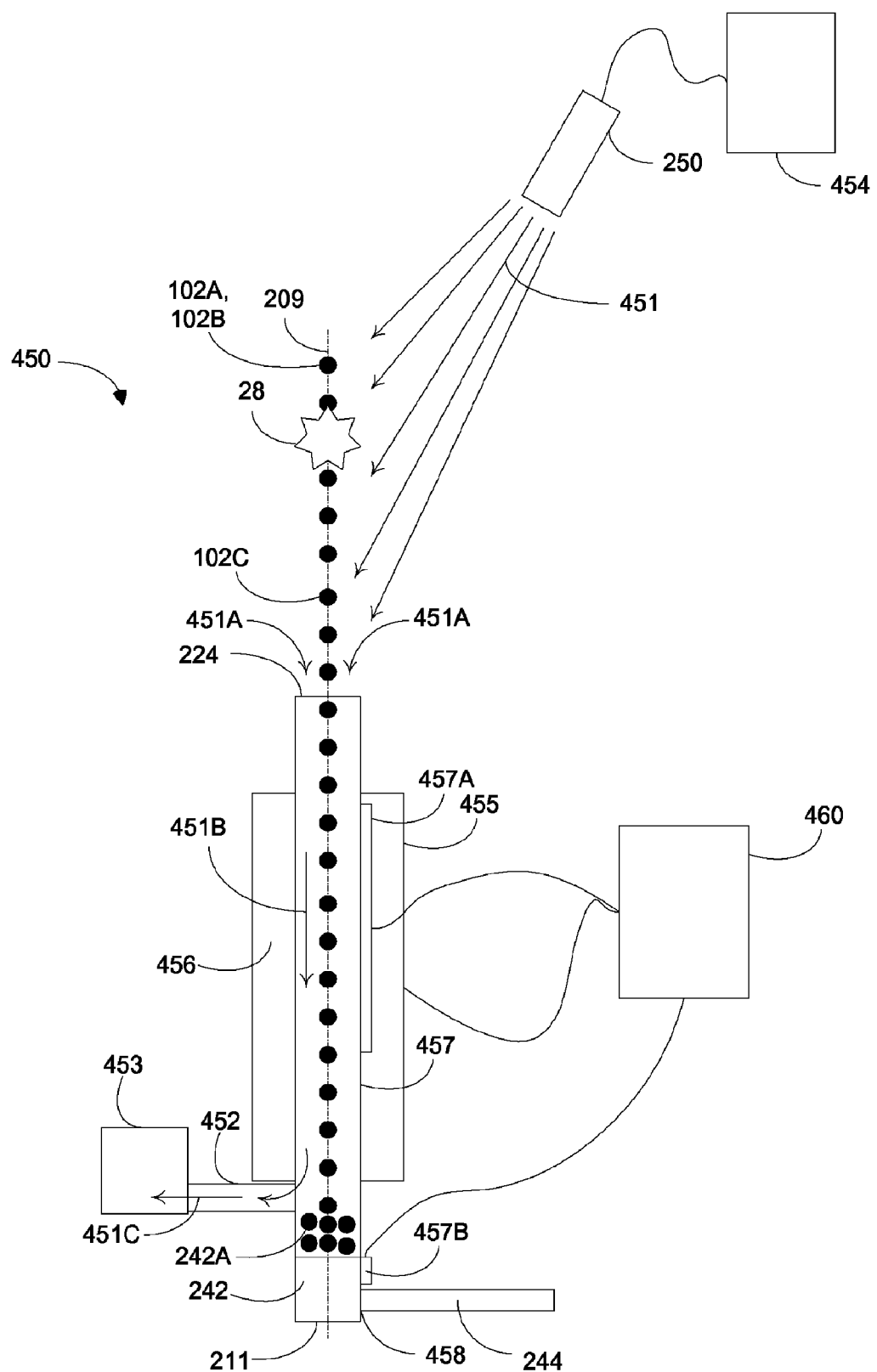
FIG. 4E is a schematic of an alternative first catch, in accordance with embodiments of the disclosed subject matter.
Figure 4F:
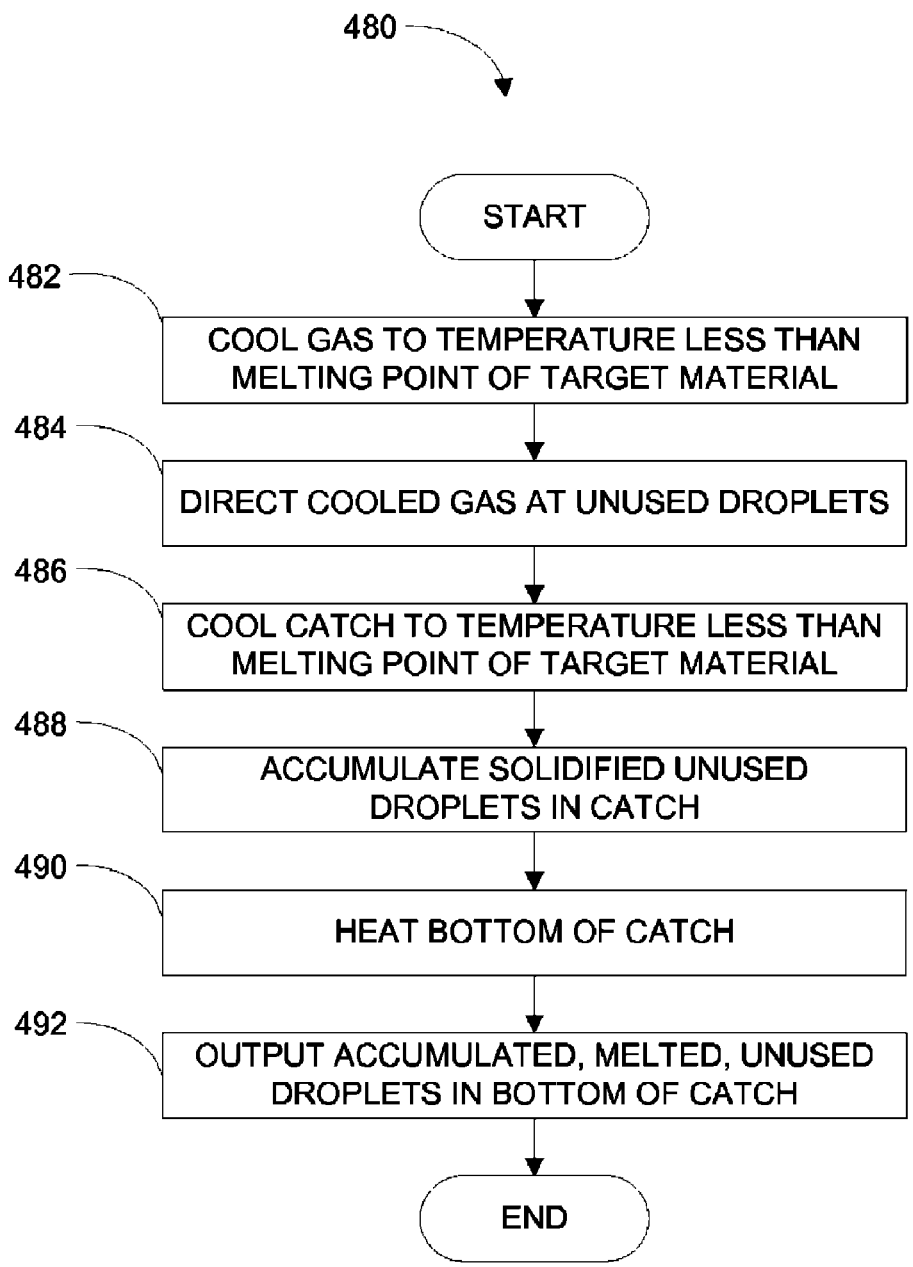
FIG. 4F is a flowchart diagram that illustrates the method operations performed in reducing backsplashing from inside the catch by cooling the unused droplets, in accordance with embodiments of the disclosed subject matter.
Figure 4G:
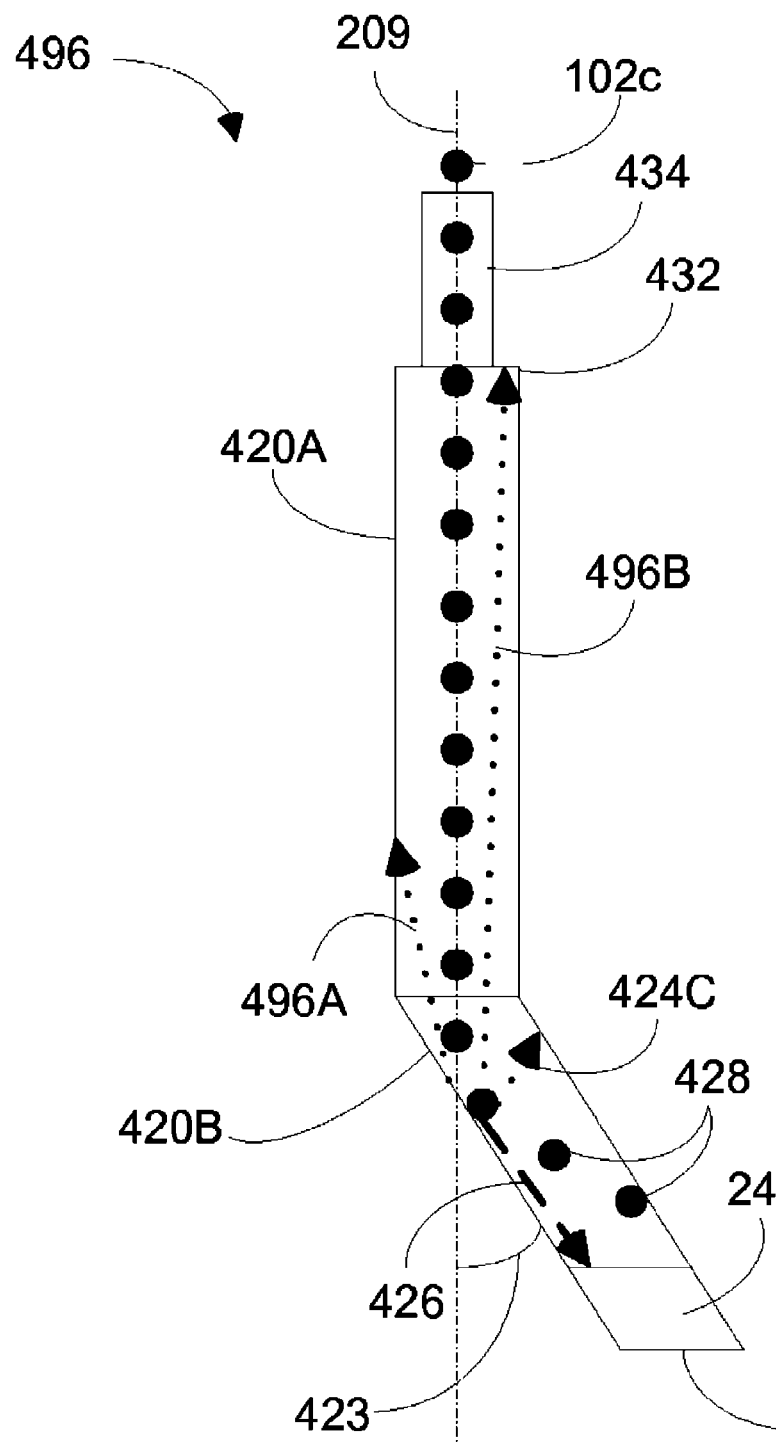
FIG. 4G is schematic of an alternative first catch, in accordance with embodiment of the disclosed subject matter.

Referring to FIG. 4G, another alternative first catch 496 is a combination of the alternative first catches 420 and 430. The combination first catch 496 includes one or more steps 432 and an angled portion 420B as described above. Impacting the inner surface of the first catch 496 at an angle more gradually slows the unused droplets and reduces the back splatter 496A, 496B and causes a portion 424C of the unused droplets to reflect to opposite side of the inner surface the catch 496. The unused droplets and backsplatter 496A, 496B are captured in the bottom of the catch 496. The step 432 reduces the backsplatter 496B similar to the baffles 412 described above.

By way of example, the two catches 210, 240 can be manufactured from titanium or other suitable materials compatible with liquid target material. The catches 210, 240 can be heated above the melting point of the target material. By way of example, for a tin target material 96, a temperature between about 232 and about 400 degrees C. At temperature lower than about 232 degrees C. the splashed tin may freeze or solidify and as the splashed material accumulates it will eventually clog the catch 210.

Once accumulated in significant amount, the liquid material 242 retrieved in the reservoir 212 can be drained through a heated tube 244. The tube 244 can act as a freeze valve as the liquid material in the tube can freeze or solidify when the material in the tube is below the melting point, this closing the tube 244. When the tube 244 is heated, the material 242 in the tube melts or liquefies and the tube opens, allowing the liquid material to flow out of the reservoir 212 or catch 210, 240.

FIG. 4E is a schematic of an alternative first catch 450, in accordance with embodiments of the disclosed subject matter. A gas flow 451 in the direction of the unused droplets 102C entering the first end 224 of the catch 450 can also assist in preventing very slow droplet fragments produced by backsplashing in the catch from escaping the catch. This gas flow can be arranged by pumping the EUV chamber 26 to a vacuum or near vacuum (e.g., less than about 10 torr). The vacuum can be drawn through an opening 452 in or near a bottom 211 of the catch 450. The gas that is pumped through the catch 450 can be the buffer gas or a gas used for etching the target material from the surface of the collector mirror 30.

If a substantial partial pressure of buffer or etchant gas is allowed in the EUV chamber 26 backsplashing can be suppressed by cooling the unused droplets 102C or all of the target material droplets 102A, 102B. By way of example, tin droplets of small size (e.g., less than about 30 μm) can be cooled by a cooling system such as a cooling gas flow or a cool mass or surface (e.g. and heat sink or the cooled first catch). The target material droplets 102A-102C can be cooled to a temperature below the melting point of the target material, so that by the time the droplets 102C reach the bottom 211 of the catch 210, the droplets will solidify e.g., into substantially solid tin spheres. Similar processes and results can be obtained with target materials other than tin. As a result, substantially all of the backsplashing caused by the droplets 102C impacting the bottom 211 and sides of the catch 210 will be eliminated.

FIG. 4F is a flowchart diagram that illustrates the method operations 480 performed in reducing backsplashing from inside the catch 450 by cooling at least some of the droplets 102A-102C, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 480 will now be described.

In an operation 482, a quantity of gas 454 is cooled to a temperature less than about the melting temperature of the target material. In operation 484, the cooled gas flow 451 is directed toward the droplets 102C such as through gas nozzle 250 shown in FIG. 4E. The gas nozzle 250 can also direct cooling gas flow 451 or other cooling process at all droplets 102A-102C emitted from the target material source such that substantially all of the target material droplets substantially solidify. The target material droplets 102A-102C can be cooled before or after passing through the irradiation region 28.

In an operation 486, the catch 450 is cooled to a temperature less than about the melting temperature of the target material. It should also be understood that operation 486 can be an optional operation to be combined with operations 482 and 484. Alternatively, operation to 486 can be an alternative operation instead of operations 482 and 484.

By way of example and with reference to FIG. 4F, the catch 450 can include a double wall 455 forming a space 456 between the wall 457 of the catch 450 and the double wall 455. A temperature control system 460 can be coupled to the space 456 to heat or cool the catch 450, or portions thereof, to a desired temperature. A fluid, gas or liquid having the desired temperature can be circulated from the temperature control system 460 through the space 456 to control the temperature of the catch 450.

Alternatively, the wall 457 can include resistive coatings 457A, 457B or resistive heating elements and the temperature control system 460 can be coupled to the resistive coatings. The temperature control system 460 can apply a suitable electrical signal to heat the wall 457 and thereby heat the catch 450 or at least a portion of the catch to the desired temperature. By way of example, the temperature control system 460 can maintain the temperature of the space 456 and the corresponding portion of the catch 450 at a first temperature (e.g., less than a melting point of the target material) and at the same time as or subsequently or in sequence, apply a suitable signal to resistive coating 457B to heat the corresponding bottom portion of the catch 450 to a different temperature (e.g., above a melting point of the target material). Other types of suitable heating elements can also be used to heat the catch, including for example a heated liquid, gas, radiant heaters or cartridge heaters.

In an operation 488, the solidified unused droplets of target material 242A accumulates at the bottom 211 of the catch 450. In an operation 490, the accumulation of target material 242A in the bottom 211 of the catch 450 is heated above the melting point of the target material. By way of example the bottom 211 of the catch 450 can be heated to a temperature above the melting point of the accumulated target material 242A by the temperature control system 460 applying a suitable electrical signal to the resistive coating 457B to heat bottom of the catch 450 to the desired temperature.

The liquid accumulation of target material 242 in the bottom 211 of the catch 450 is removed from the catch 450 through an outlet 458 in an operation 492. The outlet 458 can include a freeze valve 244 as described above in FIGS. 2B, 4E.

Figure 5:
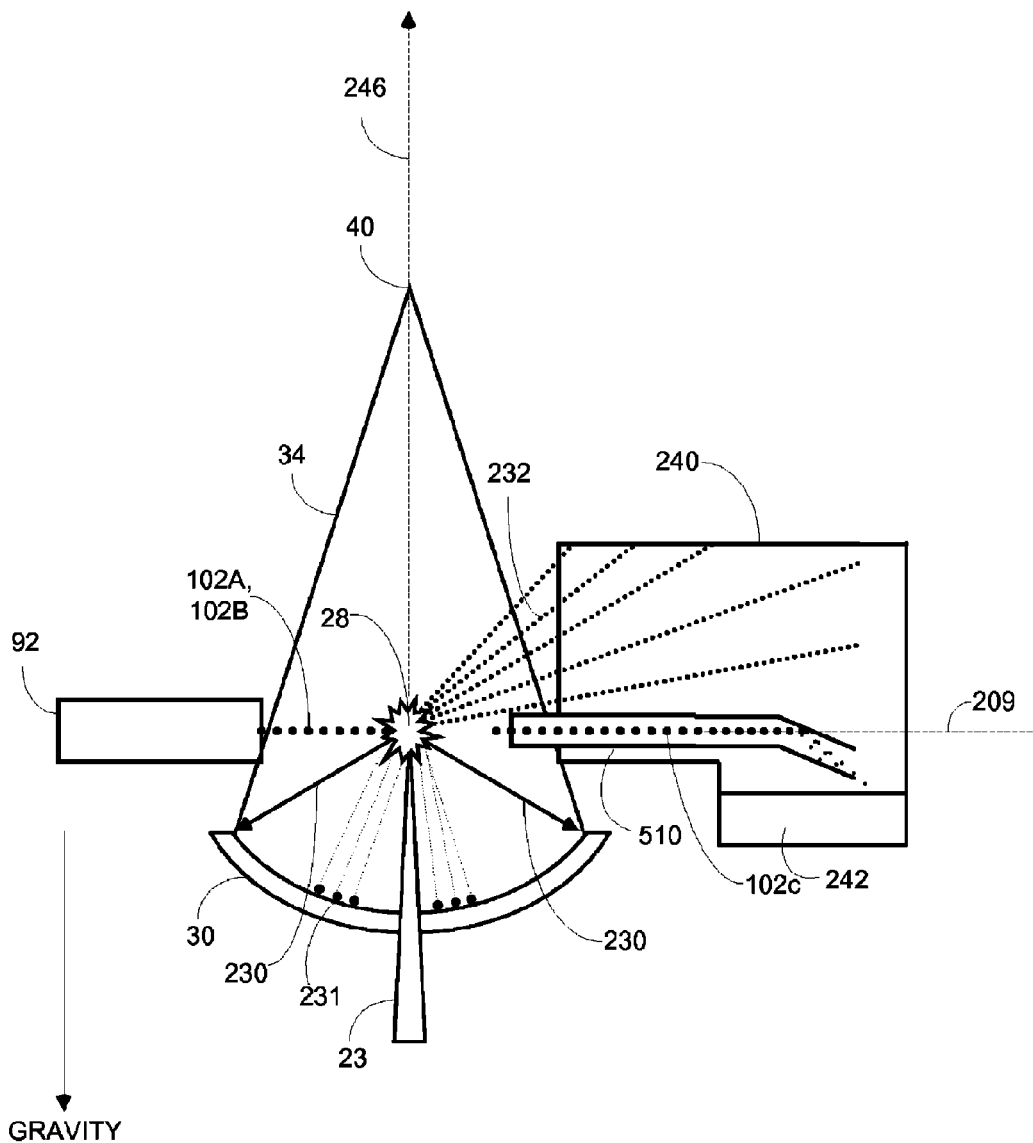
FIGS. 5 and 6 are schematics of alternative first catches, in accordance with embodiments of the disclosed subject matter.
Figure 6:
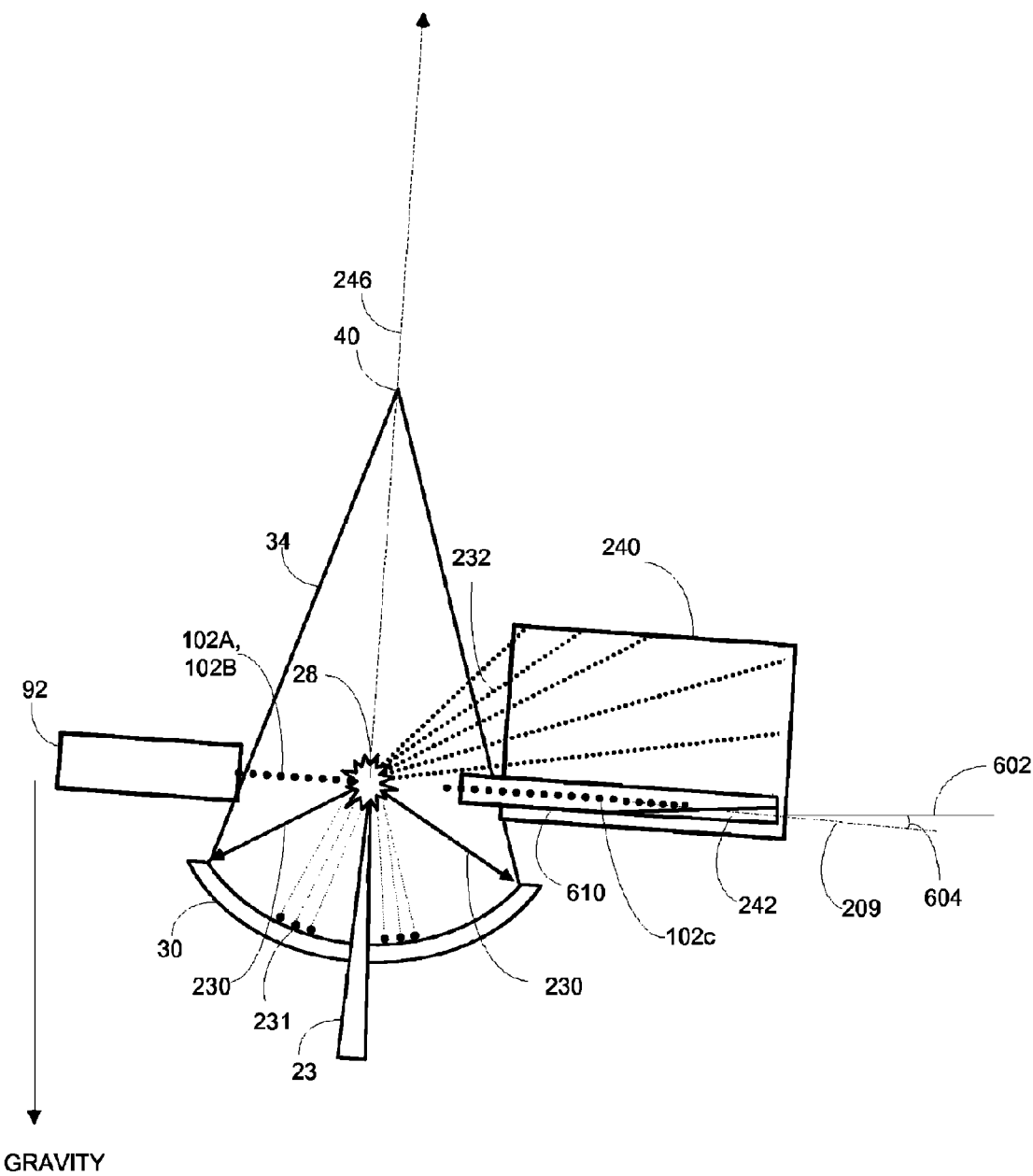

FIGS. 5 and 6 are schematics of alternative first catches 510 and 610 respectively, in accordance with embodiments of the disclosed subject matter. The alternative first catches 510 and 610 are oriented in a near horizontal orientation such that the target material path 209 is approximately horizontal. The alternative first catch 610 is oriented at a slight angle 604 to horizontal 602 such that a quantity of liquid target material 242 is stored in the alternative first catch 610 in such a manner that the incoming droplets 102C impinge on a surface of the liquid target material 242 at a very slight angle 604. Angle 604 can be between about 1 degree and less than about 30 degrees or preferably between about 1 degree and about 5 degrees. This orientation provides a relatively large surface length and area for the droplets 102C to impinge.

Figure 7:
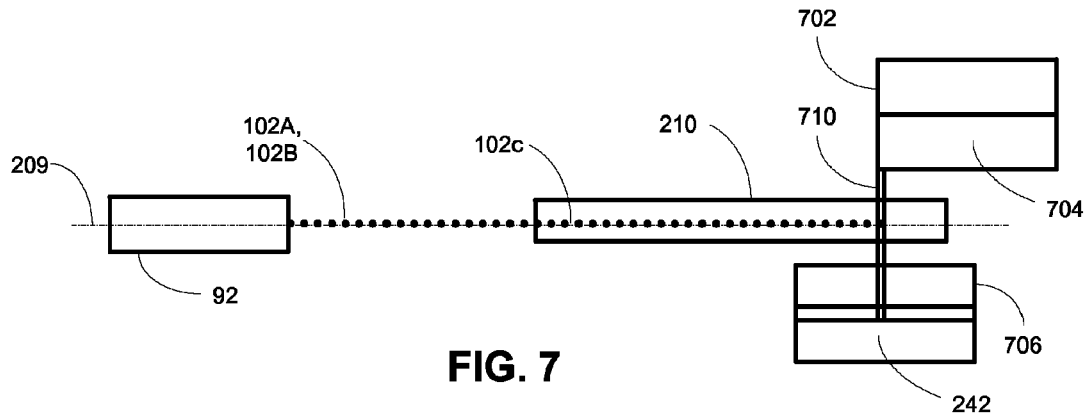
FIG. 7 is a schematic of a liquid curtain in a first catch, in accordance with embodiments of the disclosed subject matter.

FIG. 7 is a schematic of a liquid curtain 710 in a first catch 210, in accordance with embodiments of the disclosed subject matter. The liquid curtain 710 can be formed from the target material 96 of the droplets 102C. The liquid curtain 710 can be approximately perpendicular to the target material path 209. It should be understood that the liquid curtain 710 is not required to be perpendicular to the target material path but can be in any suitable angle to the target material path.

The liquid curtain 710 can be formed at the bottom end of the catch 210 or somewhere along the length of the catch. The liquid curtain 710 flows from a first reservoir 702 where a first quantity of the curtain material 704 originates or may be supplied to from another supply. The curtain 710 flows from the first reservoir 702 to a collection reservoir 706. The droplets 102C are less likely to backsplash when contacting a liquid and therefore the curtain reduces the amount of backsplash and microdroplet generation.

Figure 8:
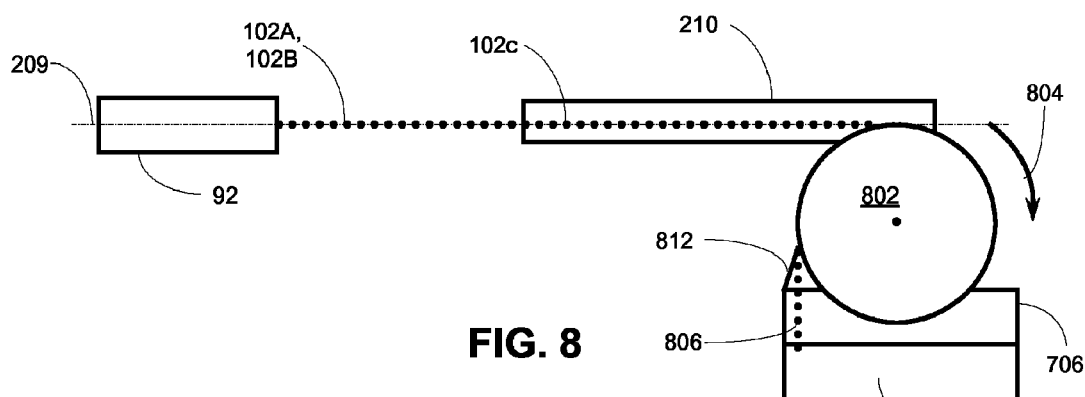
FIGS. 8 and 9 are schematics of a rotating cylinder in a first catch, in accordance with embodiments of the disclosed subject matter.
Figure 9:
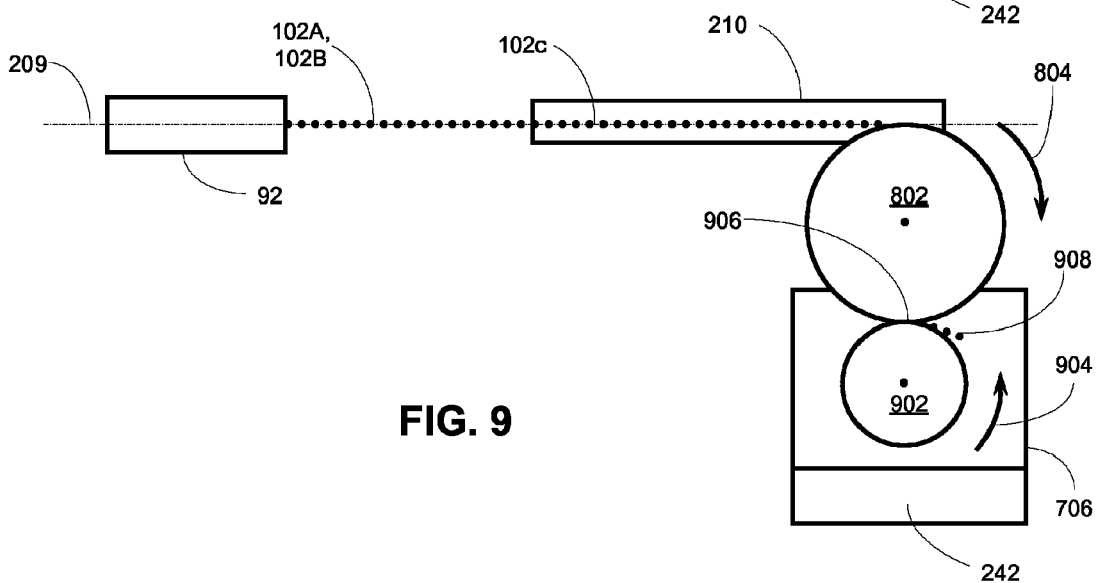

FIGS. 8 and 9 are schematics of a rotating cylinder 802 in a first catch 210, in accordance with embodiments of the disclosed subject matter. The rotating cylinder 802 is located near the bottom end of the catch 210. The first rotating cylinder 802 minimizes backsplashing in the catch 210. As the first cylinder 802 spins in direction 804 so that the outer surface of the cylinder travels at or near the same velocity of the droplets 102C then very little or no backsplashing is produced when the droplets 102C impact the rotating surface of the first cylinder 802. The target material path 209 is substantially tangential to the rotating surface of the first rotating cylinder 802.

Any material 806 accumulated on the outer surface of the first cylinder 802 can be removed by a blade 812. Alternatively, any material 908 accumulated on the outer surface of the first cylinder 802 can be removed by a second cylinder 902 rotating in a direction 904 opposite direction 804. One or both of the first cylinder 802 and the second cylinder 902 can be heated or cooled as needed to collect the and release the material 806, 908.

Figure 10:
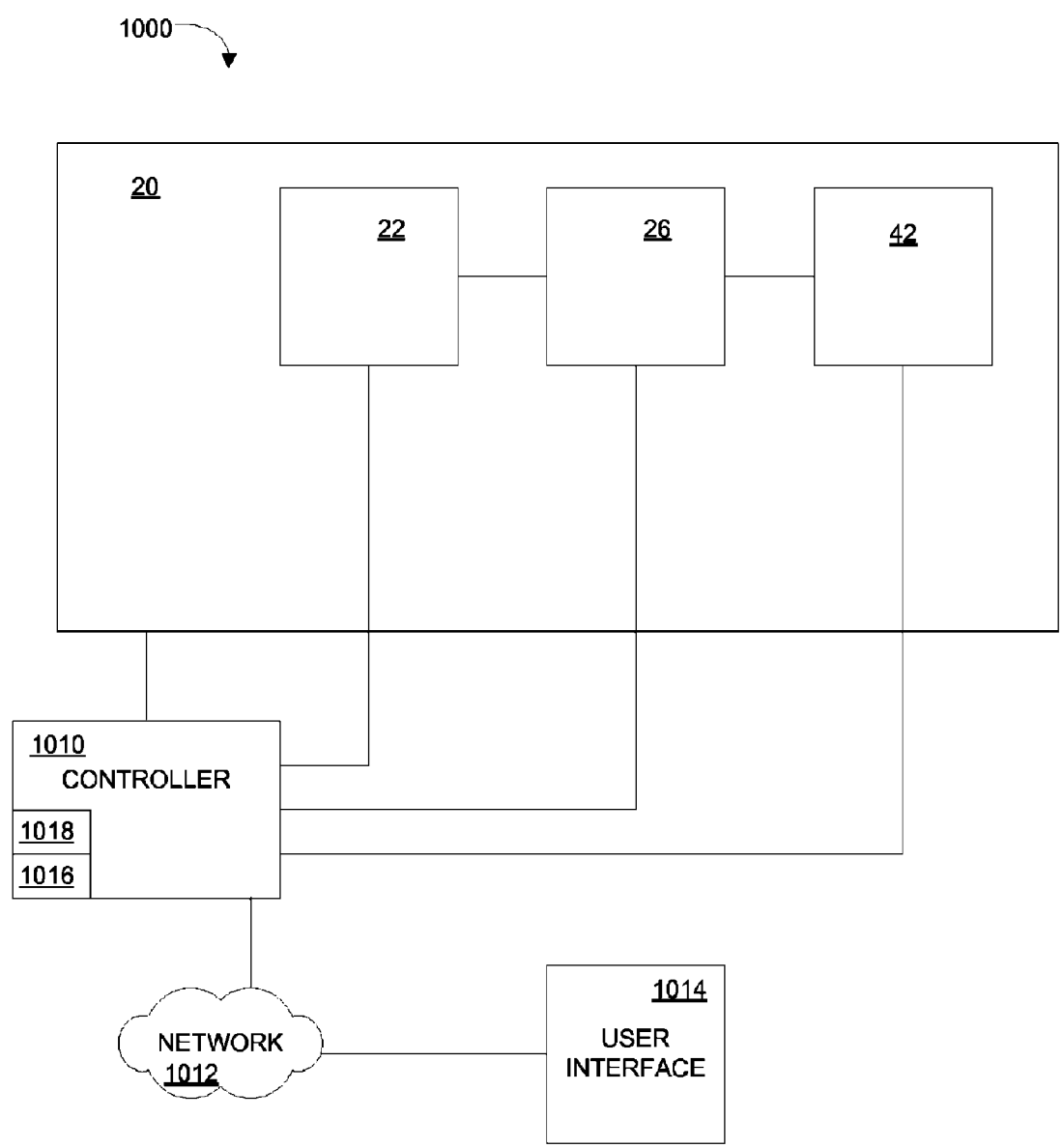
FIG. 10 is a block diagram of an integrated system including the EUV chamber, in accordance with embodiments of the disclosed subject matter.

FIG. 10 is a block diagram of an integrated system 1000 including the EUV chamber 26, in accordance with embodiments of the disclosed subject matter. The integrated system 1000 includes the EUV chamber 26, the light pulse generation system 22, the device 42 utilizing output EUV light 34, and an integrated system controller 1010 coupled to the EUV chamber, the light pulse generation system and the device utilizing output EUV light. The integrated system controller 1010 includes or is coupled to (e.g., via a wired or wireless network 1012) a user interface 1014. The user interface 1014 provides user readable outputs and indications and can receive user inputs and provides user access to the integrated system controller 1010.

The integrated system controller 1010 can include a special purpose computer or a general purpose computer. The integrated system controller 1010 can execute computer programs 1016 to monitor, control and collect and store data 1018 (e.g., performance history, analysis of performance or defects, operator logs, and history, etc.) for the EUV chamber 26, the light pulse generation system 22 and the device 42. By way of example, the integrated system controller 1010 can adjust the operations of the EUV chamber 26, the light pulse generation system 22 and/or the device 42 and/or the components therein (e.g., the first catch 210 and/or second catch 240, target material dispenser 92, etc.) if data collected dictates an adjustment to the operation thereof.

Figure 11:
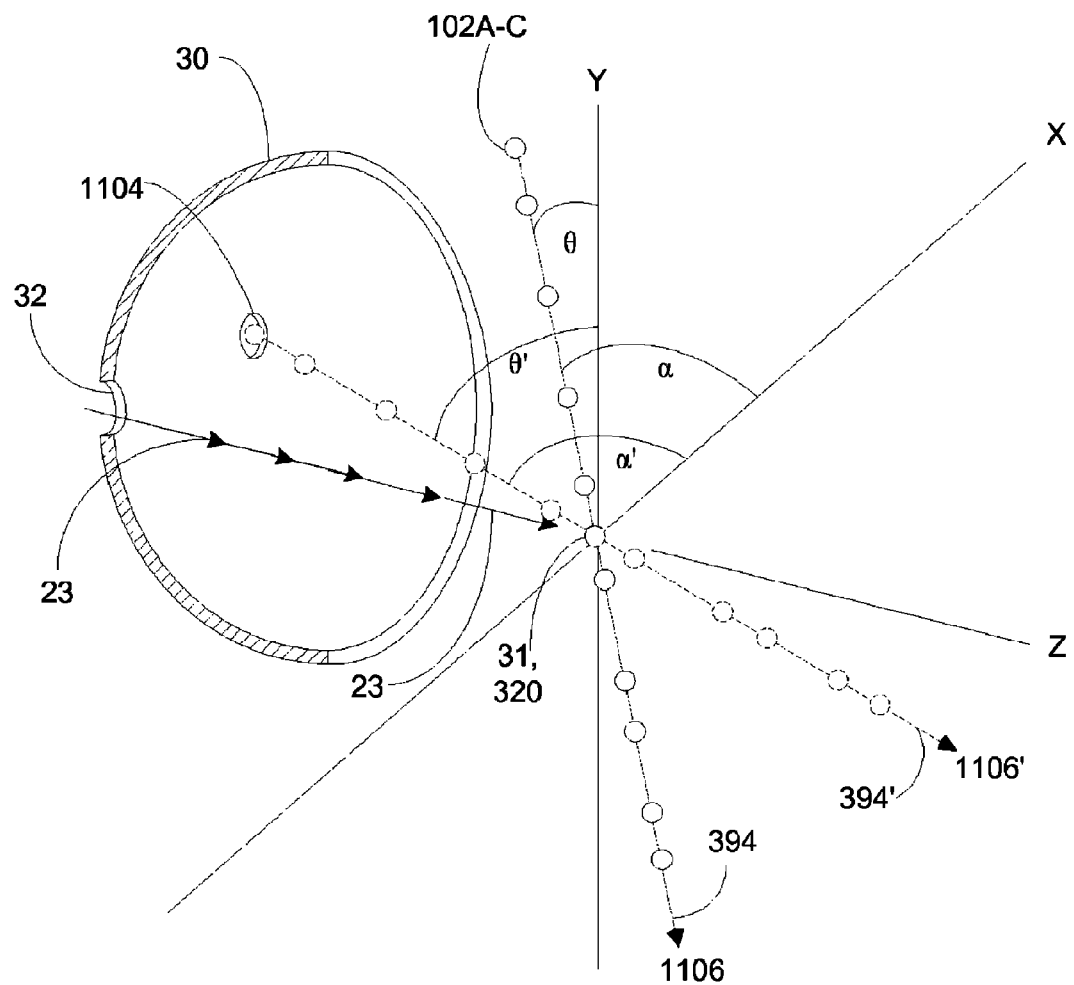
FIG. 11 is a simplified schematic of the target material path in the EUV chamber, in accordance with embodiments of the disclosed subject matter.

FIG. 11 is a simplified schematic of the target material path 394 in the EUV chamber 26, in accordance with embodiments of the disclosed subject matter. The target material path 394 can be at any angle $\theta$, $\theta'$, $\alpha$, $\alpha'$ relative to an X-Y plane that is normal to the Z axis. The EUV light path and the source laser follow the Z axis. Angle $\theta$, $\theta'$, $\alpha$, $\alpha'$ can be between about 1 and about 90 degrees. The angle $\theta$, $\theta'$, $\alpha$, $\alpha'$ relative to the X-Y plane can be an angle such as about 45 degrees that include the target material path 394' passing through an opening 1104 in the collector mirror 30.

Angling the target material path relative to the XY plane allows the droplets 102A to follow the target material path 394, 394' in a direction 1106, 1106', away from the collector mirror 30. Directing the droplets 102A in directions 1106, 1106' away from the collector mirror 30 reduces the amount of microdroplets and debris that will collect on the collector mirror 30. The amount of microdroplets that will collect on the collector mirror 30 is reduced because the momentum of the droplet 102 is away from the collector mirror 30. The momentum of the droplet is included in the momentum of the microdroplets that are generated when the droplet 102A is irradiated at the primary focus 31 of the collector mirror 30.

The momentum of the droplet 102A in direction 1106, 1106' is also away from the primary focus 31 of the collector mirror 30. This added momentum reduces the amount of microdroplets that can interfere with a subsequent droplet being irradiated as the momentum carries more of the micro particles away from the primary focus 31 of the collector mirror 30.

Figure 12A:
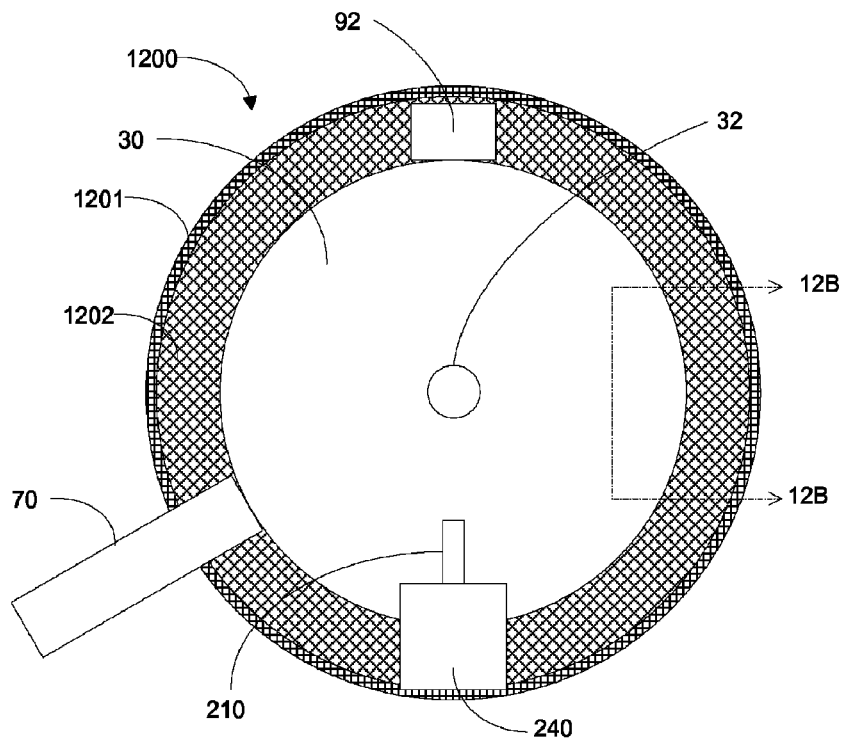
FIG. 12A is a simplified sectional view of sect of the EUV chamber, in accordance with embodiments of the disclosed subject matter.
Figure 12B:
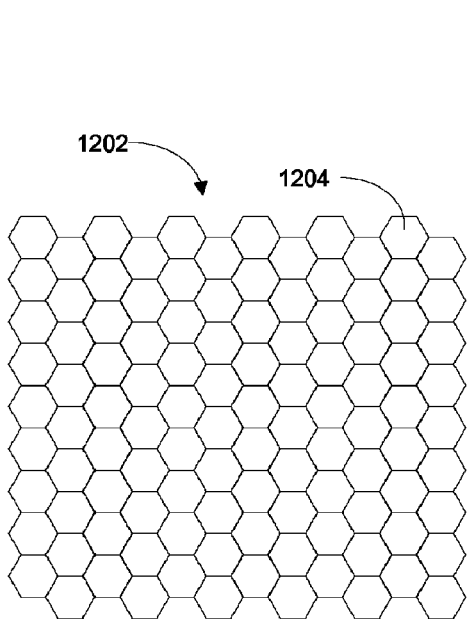
FIGS. 12B and 12C are detailed vies of a further sectional view, in accordance with embodiments of the disclosed subject matter.
Figure 12C:
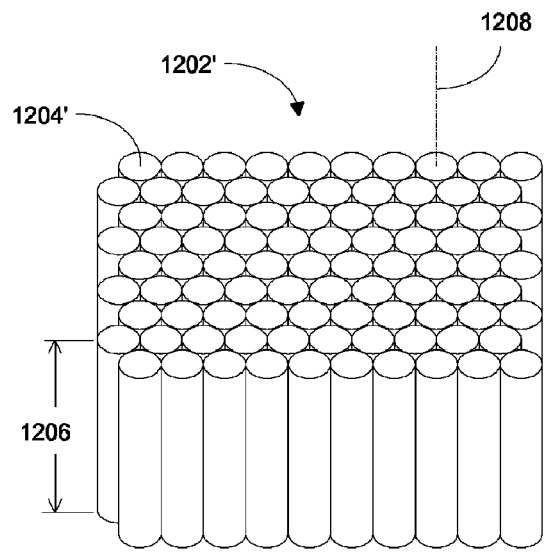

FIG. 12A is a simplified sectional view of sect 12-12 of the EUV chamber 26, in accordance with embodiments of the disclosed subject matter. Sect 12-12 is shown in FIG. 1 above. FIGS. 12B and 12C are detailed vies of a further sectional view 12B-12B, in accordance with embodiments of the disclosed subject matter. A cross section of the EUV chamber wall 1201 is shown. Inside the EUV chamber wall 1201 is a microdroplet and droplet trap system 1202. The trap system 1202 can cover a portion of or the entire inner surface of the EUV chamber that is not required for some other purpose such as the collector mirror 30 or the droplet catches 210, 210 or an instrument 70 for a monitoring or control system.

Referring now to FIGS. 12B and 12C the trap system 1202 includes a large number of microdroplet catches 1204. Each of the microdroplet catches 1204 have a diameter of between about 1 mm and about 10 mm. Each of the microdroplet catches 1204 have an aspect ratio of between about 3 to about 8 or more. By way of example the microdroplet catches 1204 can have a diameter of about 5 mm and a depth 1206 of between about 15 and about 40 mm.

The microdroplet catches 1204 can have any suitable shape. As shown in FIG. 12B the microdroplet catches 1204 have a hexagonal shape. As shown in FIG. 12C the microdroplet catches 1204' have a rounded or more tubular shape.

The open ends of each of the microdroplet catches 1204 can be directed directly toward the Z axis of the EUV chamber. By way of example, the centerline 1208 of each of the microdroplet catches 1204 can be perpendicular to the Z axis of the EUV chamber.

Alternatively, the centerline 1208 of each of the microdroplet catches 1204 can be directed toward the primary focus 31 of the EUV chamber or some angle slightly away from the primary focus 31 of the EUV chamber.

The microdroplet catches 1204 perform a function similar to the droplet catches 210, 240 described above and therefore many of the design considerations (e.g., materials, angles, features, etc.) can be similarly applied to the microdroplet catches 1204. The microdroplet catches 1204 provide many internal surfaces to capture the microdroplets such that the microdroplets will impact on the inner surfaces of the microdroplet catches 1204 and these impacts will dissipate the energy carried by the microdroplet such that the microdroplet will not deflect or reflect out of the microdroplet catches. In this manner the microdroplet catches 1204 trap the microdroplet and reduce the number of microdroplets that can deflect back on to the collector mirror 30.

The microdroplet catches 1204 can be actively or passively heated or cooled as may be required for the desired function similar to the droplet catches 210, 240 described above. It should be understood that the microdroplet catches 1204 can be operated independently of the droplet catches 210, 240 and even heated or cooled in opposite manners such that when droplet catch 210 is heated the microdroplet catches 1204 can be actively or passively heated or cooled.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An extreme ultraviolet light chamber comprising:
    a collector mirror;
    a droplet generation system having a droplet outlet aligned to output a plurality of droplets along a target material path; and
    a first catch including:
        a first open end substantially aligned to the target material path;
        an enclosed second end, the second end being opposite from the first open end; and
        at least one internal surface oriented toward a second end of the first catch, wherein the at least one internal surface includes at least one step.

2. The chamber of claim 1, wherein the first catch further includes a centered axis substantially aligned to the target material path.

3. The chamber of claim 1, wherein the first catch further includes a centered axis at a selected angle to the target material path, the selected angle being between about 1 and about 30 degrees.

4. The chamber of claim 1, wherein the first catch further includes a plurality of baffles, each one of the plurality of baffles having a first end, a second end, a first surface and a second surface opposite the first surface, the first end being attached to the inner surface of the first catch, the second surface forming an acute angle to the inner surface of the first catch.

5. The chamber of claim 1, wherein the first open end has a first width and the first catch has second width at the at least one step, the second width being larger than the first width.

6. The chamber of claim 1, wherein the first catch further includes a first portion having a centered axis substantially aligned to the target material path and a second portion forming an angle of between about 1 and about 45 degrees to the target material path.

7. The chamber of claim 1, wherein the first catch further includes a second end opposite the first open end and further includes a quantity of liquid proximate to the second end.

8. The chamber of claim 7, wherein the quantity of liquid proximate to the second end is a liquid state of a target material used to form the plurality of droplets.

9. The chamber of claim 7, wherein the quantity of liquid proximate to the second end extends along at least a portion of the inner surface of the first catch.

10. The chamber of claim 7, wherein the quantity of liquid proximate to the second end includes a liquid curtain.

11. The chamber of claim 10, wherein the liquid curtain contains a liquid state of a target material used to form the plurality of droplets.

12. The chamber of claim 1, wherein the target material path is substantially horizontal.

13. The chamber of claim 1, wherein the target material path is substantially vertical.

14. The chamber of claim 1, wherein the first catch further includes a second end opposite the first open end and further includes a first rotating cylinder proximate to the second end.

15. The chamber of claim 14, wherein the first rotating cylinder is positioned such that the target material path is substantially tangential to a first rotating surface of the first rotating cylinder.

16. The chamber of claim 15, wherein the first rotating cylinder is coupled to a cylinder drive capable of driving the first rotating cylinder such that the first rotating surface of the first rotating cylinder has a surface velocity substantially equal to a velocity of the plurality of droplets.

17. The chamber of claim 15, further comprising a second rotating cylinder, the second rotating cylinder having a second rotating surface contacting the first rotating surface of the first rotating cylinder.

18. The chamber of claim 1, further comprising a second catch, the second catch having a width substantially larger than the first catch, the second catch surrounding the first catch.

19. The chamber of claim 1, further comprising an outlet from the first catch.

20. The chamber of claim 19, wherein the outlet from the first catch includes a freeze valve.

21. The chamber of claim 1, wherein the first open end of the first catch has a width of between about 20 and 100 mm.

22. The chamber of claim 1, further comprising a temperature control system for cooling at least some of the plurality of target material droplets to a temperature less than a melting temperature of the target material.

* * * * *